United States Patent
Cok

(10) Patent No.: US 7,470,569 B2
(45) Date of Patent: Dec. 30, 2008

(54) OLED DISPLAY MANUFACTURING METHOD WITH UNIFORMITY CORRECTION

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 810 days.

(21) Appl. No.: 11/093,231

(22) Filed: Mar. 29, 2005

(65) Prior Publication Data

US 2006/0227084 A1  Oct. 12, 2006

(51) Int. Cl.
*H01L 21/20* (2006.01)
(52) U.S. Cl. .......................... 438/141; 438/16; 438/82; 257/E51.022
(58) Field of Classification Search ................ 438/16, 438/141; 257/E51.022; 345/55, 77
See application file for complete search history.

(56) References Cited

U.S. PATENT DOCUMENTS

| 6,081,073 | A | 6/2000 | Salam |
| 6,414,661 | B1 * | 7/2002 | Shen et al. ............... 345/82 |
| 6,473,065 | B1 * | 10/2002 | Fan .......................... 345/82 |
| 2005/0030267 | A1 * | 2/2005 | Tanghe et al. ............ 345/82 |

OTHER PUBLICATIONS

U.S. Appl. No. 10/858,260, filed Jun. 1, 2004; Ronald S. Cok et al; "Uniformity And Brightness Measurement In OLED Displays".
U.S. Appl. No. 10/869,009, filed Jun. 16, 2004; Ronald S. Cok et al; "Method And Apparatus For Uniformity And Brightness Correction In An OLED Display".
U.S. Appl. No. 10/894,729, filed Jul. 20, 2004; Ronald S. Cok et al; "Method And Apparatus For Uniformity And Brightness Correction In An OLED".

* cited by examiner

*Primary Examiner*—Walter L Lindsay, Jr.
*Assistant Examiner*—Abdulfattah Mustapha
(74) *Attorney, Agent, or Firm*—Andrew J. Anderson

(57) ABSTRACT

A method for manufacturing and grading OLED devices comprising the steps of: a) manufacturing OLED devices having a plurality of pixels with inherent pixel brightnesses and uniformity variation; b) measuring inherent pixel brightnesses and uniformity variation performance for each of the OLED devices; c) grading each of the OLED devices based on their inherent performance; d) selling OLED devices graded as acceptable without correction of inherent performance; e) correcting pixel brightness and uniformity variation performance for at least some of the OLED devices graded as not acceptable to render them acceptable; and f) selling OLED devices having pixel brightness and uniformity performance correction.

12 Claims, 8 Drawing Sheets

OLED DISPLAY MANUFACTURING METHOD WITH UNIFORMITY CORRECTION

FIELD OF THE INVENTION

The present invention relates to the manufacture of OLED displays and, in particular, a method for improving yields and reducing costs of OLED displays.

BACKGROUND OF THE INVENTION

Organic Light Emitting Diodes (OLEDs) have been known for some years and have been recently used in commercial display devices. Such devices employ both active-matrix and passive-matrix control schemes and may employ a plurality of pixels. The pixels are typically arranged in two-dimensional arrays with a row and a column address for each pixel and having a data value associated with the pixel value. However, such displays suffer from a variety of defects that limit the quality of the displays. In particular, OLED displays suffer from non-uniformities in the pixels. These non-uniformities can be attributed to both the light-emitting materials in the display and, for active-matrix displays, to variability in the thin-film transistors used to drive the light emitting elements.

Referring to FIG. 2, in a current manufacturing and grading process, the OLED devices are first manufactured. This manufacturing step 100 involves, e.g., the preparation of a substrate, typically glass, the formation of electrodes and other electronic components on the substrate, the deposition of organic material layers, the addition of a second electrode, the encapsulation of the device, optionally followed by singulation, packaging, and the attachment of electrical connectors. After the OLED device is manufactured, its performance is measured 110 to ensure that the light-emitting elements of the OLED device are working properly. Some faults may be present, for example stuck-on or stuck-off pixels, dark or bright pixels, and other non-uniform pixels. The OLED device may or may not meet the standards of the application for which it is intended so it is graded 120. If the OLED device does not meet the specification standards of the application, a repair 130 may be attempted. If the repair is not possible, the display is discarded 180. If it can be repaired, the repair is performed and the device tested 110 again.

OLED devices may be burned-in either as a part of the manufacturing process or later as a part of the testing and repair process. This burn-in process may be necessary to ensure a stable operation of the device when it is first used in an application. If the device does not meet the specification after burn-in, any repairs and grading, it is discarded 180. If it does meet the specification, it may be sold to a customer 140.

This process is effective but suffers from a high rejection rate. Some faults in light emitters may be compensated using a variety of means taught in the art. For example, copending, commonly assigned U.S. Ser. Nos. 10/858,260, 10/869,009 and 10/894,729 describe various means to detect and correct for some faults found in OLED devices. Other methods, for example, U.S. Pat. No. 6,414,661 B1 entitled "Method and apparatus for calibrating display devices and automatically compensating for loss in their efficiency over time" by Shen et al issued 20020702 describes a method and associated system that compensates for long-term variations in the light-emitting efficiency of individual organic light-emitting diodes in an OLED display device by calculating and predicting the decay in light output efficiency of each pixel based on the accumulated drive current applied to the pixel and derives a correction coefficient that is applied to the next drive current for each pixel. The compensation system is best used after the display device has been calibrated to provide uniform light output. This patent provides a means for correcting the non-uniformities through the use of a look-up table.

U.S. Pat. No. 6,473,065 B1 entitled "Methods of improving display uniformity of organic light emitting displays by calibrating individual pixel" by Fan issued 20021029 describes methods of improving the display uniformity of an OLED. In order to improve the display uniformity of an OLED, the display characteristics of all organic-light-emitting-elements are measured, and calibration parameters for each organic-light-emitting-element are obtained from the measured display characteristics of the corresponding organic-light-emitting-element. The calibration parameters of each organic-light-emitting-element are stored in a calibration memory. The technique uses a combination of look-up tables and calculation circuitry to implement uniformity correction.

All of these correction schemes require uniformity and/or performance calibration information to be effective. However, the art does not teach selective application of correction steps in order to reduce the cost and improve the yield of the manufactured product, thereby optimizing the manufacturing process. There is a need, therefore, for an improved method of providing uniformity and reducing manufacturing costs in an OLED display manufacturing process.

SUMMARY OF THE INVENTION

In accordance with one embodiment, the invention is directed towards a method for manufacturing and grading OLED devices, comprising the steps of: a) manufacturing OLED devices having a plurality of pixels with inherent pixel brightnesses and uniformity variation; b) measuring inherent pixel brightnesses and uniformity variation performance for each of the OLED devices; c) grading each of the OLED devices based on their inherent performance; d) selling OLED devices graded as acceptable without correction of inherent performance; e) correcting pixel brightness and uniformity variation performance for at least some of the OLED devices graded as not acceptable to render them acceptable; and f) selling OLED devices having pixel brightness and uniformity performance correction.

ADVANTAGES

The present invention has the advantage of providing improved yields and reduced costs in manufacture of OLED displays.

DETAILED DESCRIPTION OF THE INVENTION

Figure 1:
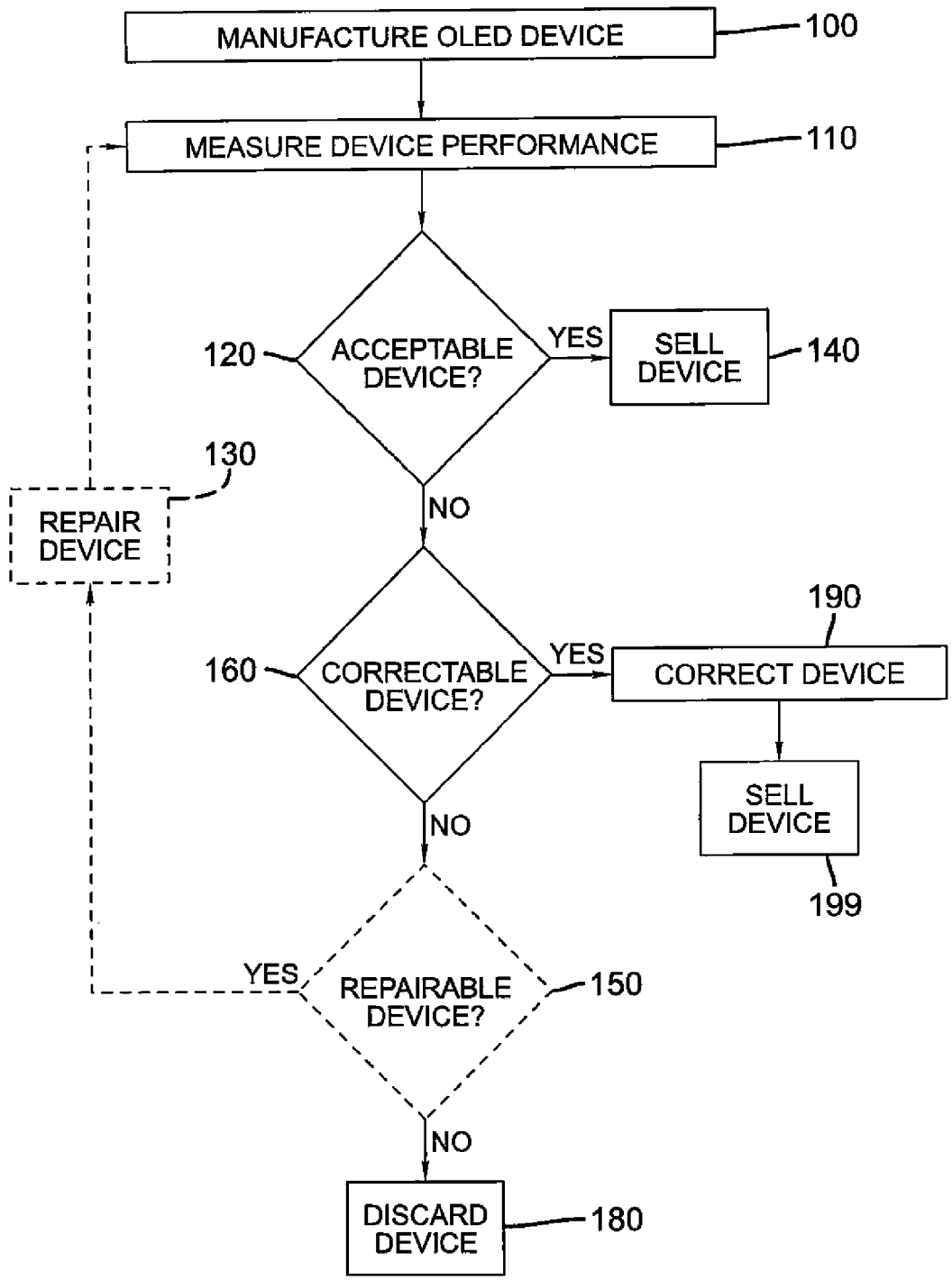
FIG. 1 is a flow diagram illustrating the method of the present invention.
Figure 2:
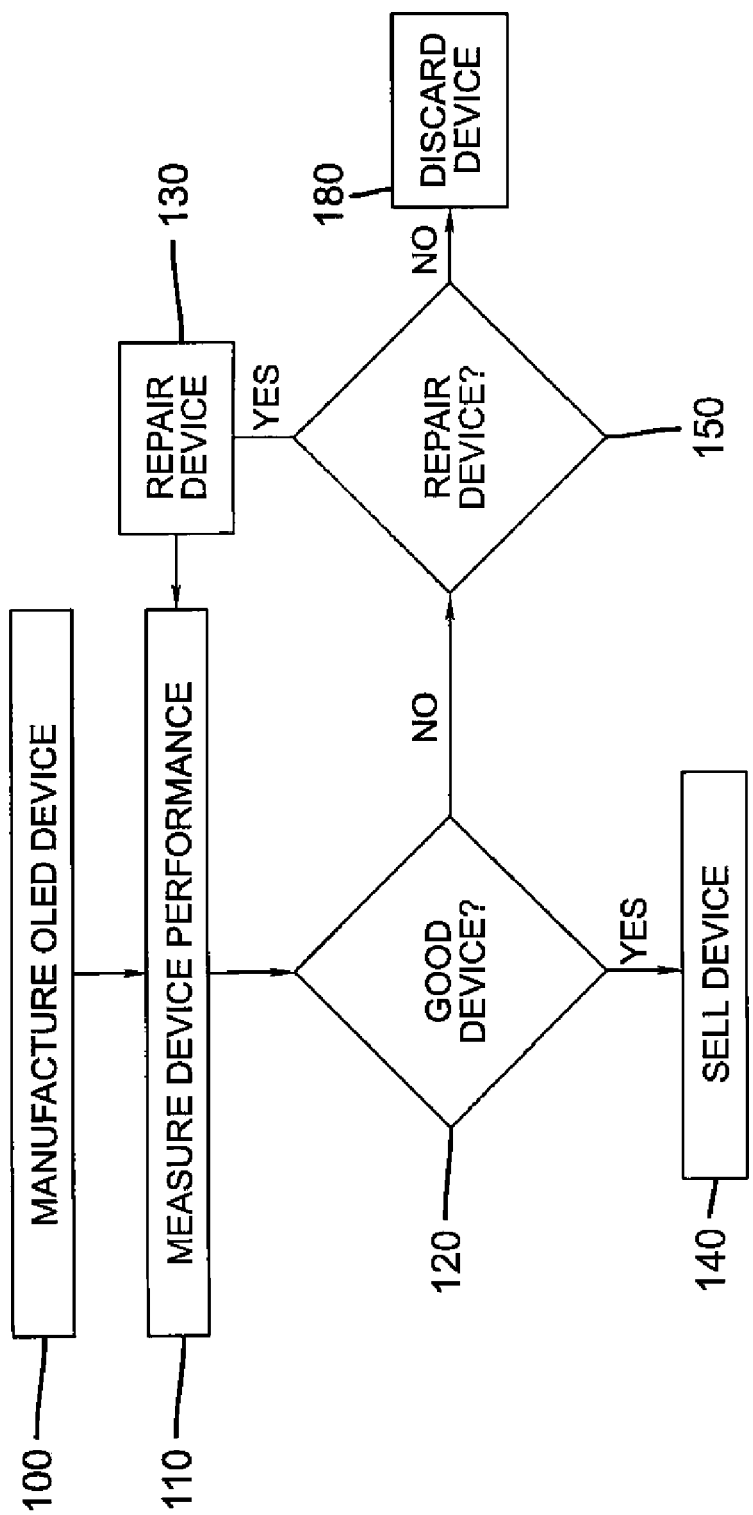
FIG. 2 is a flow diagram illustrating a currently practiced OLED device manufacturing method.

Referring to FIG. 1, a method for manufacturing an OLED device and providing improved correction of brightness and uniformity variations at a reduced cost, comprises the steps of manufacturing 100 OLED devices having a plurality of pixels with inherent pixel brightnesses and uniformity variation; measuring 110 inherent pixel brightnesses and uniformity variation performance for each of the OLED devices; grading 120 each of the OLED devices based on their inherent performance; selling 140 OLED devices graded as acceptable without correction of inherent performance; correcting 190 pixel brightness and uniformity variation performance for at least some of the OLED devices graded as not acceptable to render them acceptable; and selling 199 OLED devices having pixel brightness and uniformity performance correction. The inherent performance of a device is intended to reference the actual pixel performance without any external selective pixel performance correction mechanisms, e.g., as might be provided in a controller.

If the device does not meet a specification 120, it may be graded as correctable 160. If it is not correctable, it may be discarded 180, or optionally repaired if repairable. If it is correctable, the OLED device is corrected 190 and sold 199 as described above. In a further embodiment of the present invention, after the grading steps 120 and 160, OLED devices that do not meet a specification, but that are graded as repairable 150, may be sent out for repair 130, for example by using laser repair techniques known in the art. Such techniques can repair the inherent performance of some, but not all, OLED devices, potentially rendering them acceptable or correctable. In alternative embodiments, repairs may be made as a part of the initial manufacturing process, or after the initial acceptability test.

Burn-in of an OLED device may be performed in conjunction with the present invention by burning the device in prior to an initial performance measurement or after the initial measurement and prior to a subsequent measurement.

In additional embodiments, the OLED device may be sold for a first price in step 140 and a second price in step 199. Since the cost of correcting the OLED device increases the cost of the OLED device (since additional hardware may be associated with the OLED device as described below), and since it is possible that the OLED device may have a higher performance because it is more uniform, it may be desirable to charge a second price higher than the first price. Alternatively, the grading standards may be such that the first price will be higher than the second price, thereby reducing the profitability of the sale.

Because the OLED devices not initially graded as acceptable or repairable may be corrected and sold, the yields of the manufacturing process may be improved. Because only those OLED devices not initially graded as acceptable or repairable are corrected, additional cost associated with the correction is limited to only the OLED devices that require correction to meet a desired performance specification.

The information gained by measuring the performance of each element in the OLED device is used to form correction parameters employed to compensate the OLED device for non-uniformities. The information is typically stored in a memory and applied by a controlling device, such as an integrated circuit controller or computer. The controlling device then employs the information to create signals that compensate the OLED device for non-uniformities. The information can include, but is not limited to, the light output from each light-emitting element of each pixel of the OLED device, brightness information for the OLED display as a whole, an identifier for the OLED device, the size, type, resolution, color, pixel patterns, materials, control signal, and display type information. As is known in the art, OLED devices also tend to age and decrease their light output over time as the OLEDs are used. In a further embodiment, the information from the initial measurement step 110 and, optionally, from any subsequent measurement step, is employed to form a record of the aging characteristics of the OLED device. In a specific embodiment, inherent performance characteristics may be measured before and after a burn-in step to characterize the rate of aging of the OLED device. This aging characteristic information may also be stored in a memory and used by a controller to provide aging compensation to the OLED device in an application.

OLED devices may have light emitting elements of different colors. The color elements may have their own performance characteristics, for example brightness, uniformity variation, and aging characteristics. The process described herein may be applied to each color plane of an OLED device separately. That is, the performance characteristics of, for example, the red light emitters may be measured, graded, and corrected, as necessary.

The method of manufacturing an OLED device, as described in step 100, is known in the art and may include the steps of providing a substrate, forming electronic circuitry including signal and power connections on the substrate, forming an electrode on the substrate, depositing layers of organic materials over the first electrode, forming a second electrode over the layers of organic materials, encapsulating the OLED device, singulating the OLED device, and attaching electrical connections to the signal and power conductors on the OLED device.

Referring to FIGS. 3-7, the method of the present invention may be implemented by a system for manufacturing an OLED device and providing improved correction of brightness and uniformity variations, comprising equipment 210 for manufacturing an OLED device; a measurement tool 220 for measuring the initial performance of the OLED device 200, including brightness and uniformity variations; means for grading 240 the OLED device after burn-in and correction; and a circuit 230 for correcting the brightness and uniformity variations of the OLED device.

Figure 3:
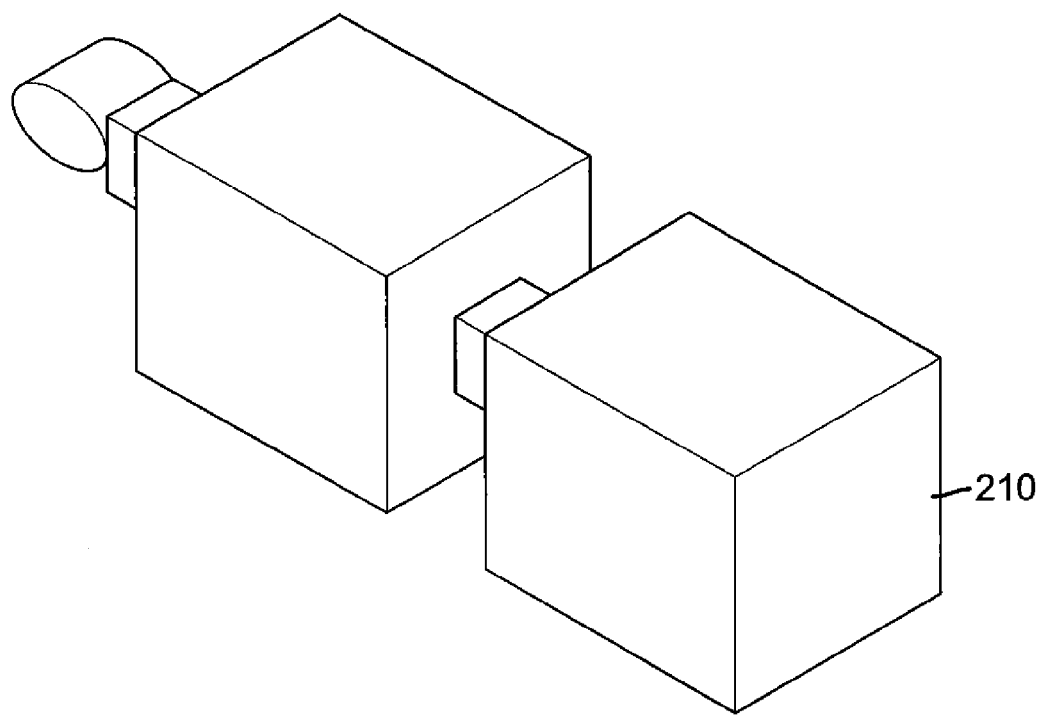
FIG. 3 is a perspective view of OLED device manufacturing equipment.
Figure 4:
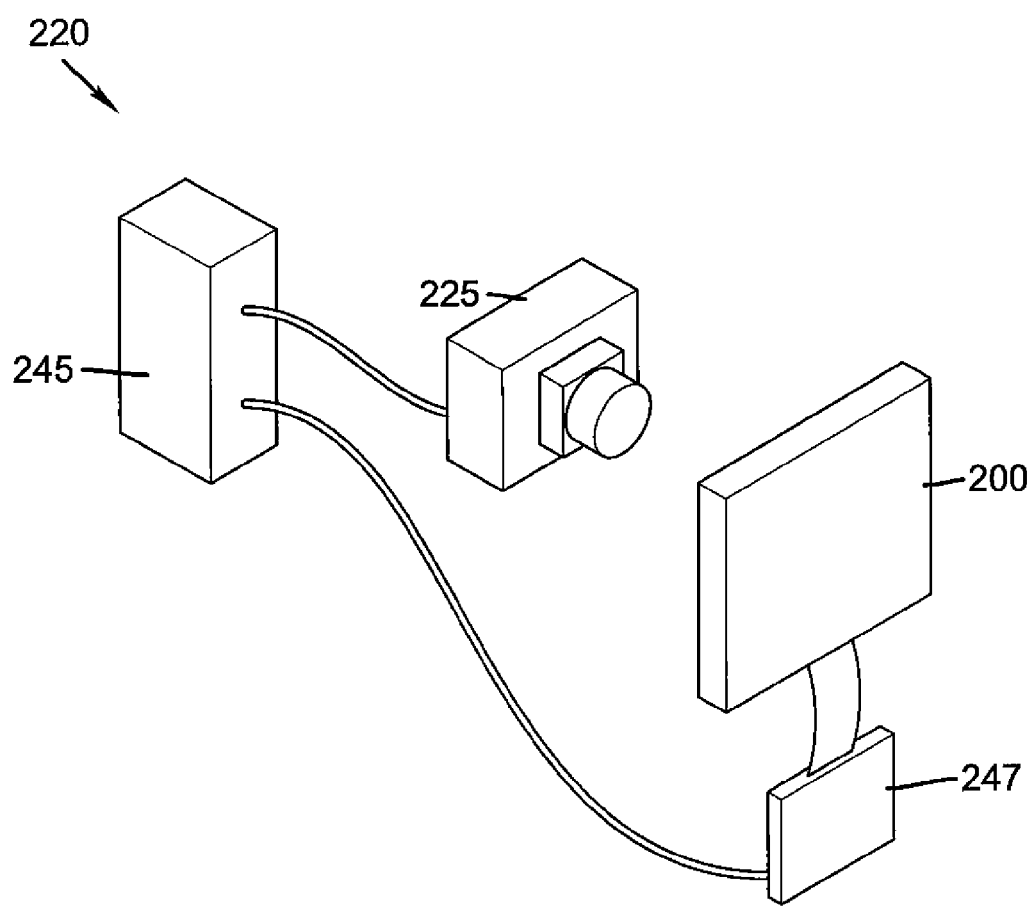
FIG. 4 is a perspective view of an OLED device performance measurement tool.

Referring to FIG. 3, manufacturing equipment 210 for manufacturing an OLED device is available from a variety of commercial vendors and may include, e.g., silicon deposition and photo-lithography equipment and organic layer deposition by means of evaporation or other coating technologies. A measurement tool 220 (FIG. 4) for measuring the performance characteristics of an OLED device 200 may include a digital camera 225 and controlling computer 245. The manufactured OLED device 200 may also be connected via a connector 247 to the controlling computer 245 to drive the OLED device 200 and digital camera 225 to measure the performance characteristics of the OLED device. Means to control an OLED device 200, a digital camera 225, programs for a computer 245 and suitable image and signal processing techniques are all known in the art and suitable designs are described in the references cited below.

Figure 5:
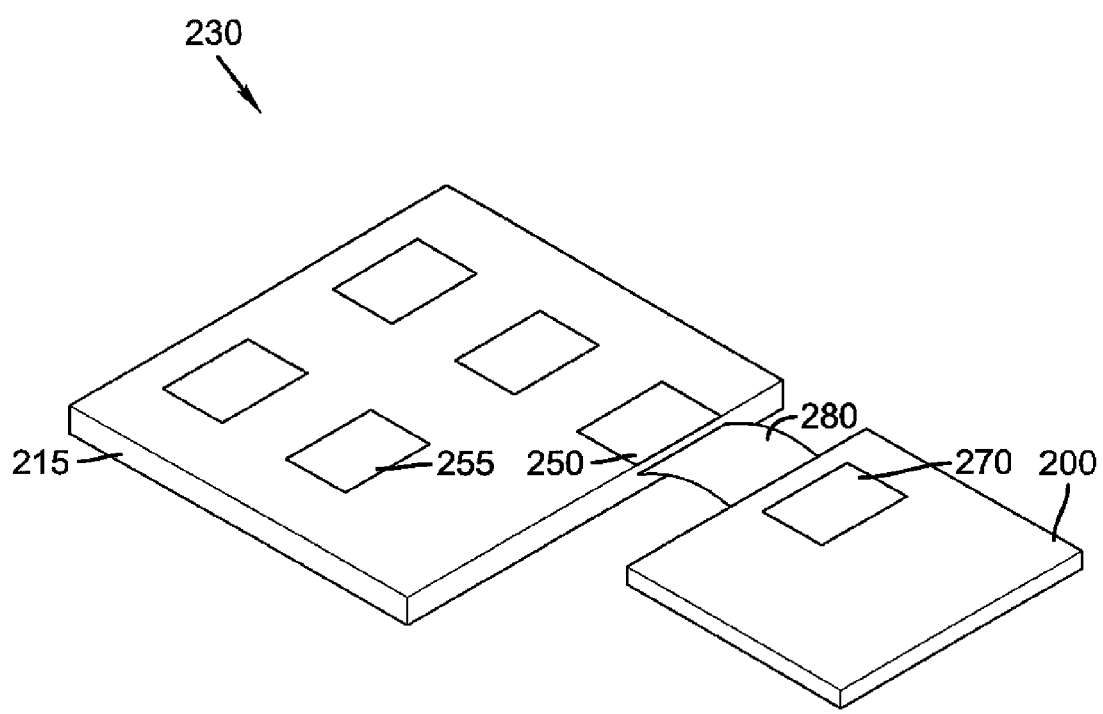
FIG. 5 is a perspective view of a circuit board and integrated circuits for correcting brightness and uniformity variations of OLED devices.

Referring to FIG. 5, the correction of uniformity and brightness variations in an OLED device 200 may be accomplished with commercially available integrated circuits 255, for example ASICs, memories, signal processors, and digitalto-analog convertors. Such circuits may be integrated onto a printed circuit board 215 together with a display controller 250.

Figure 6:
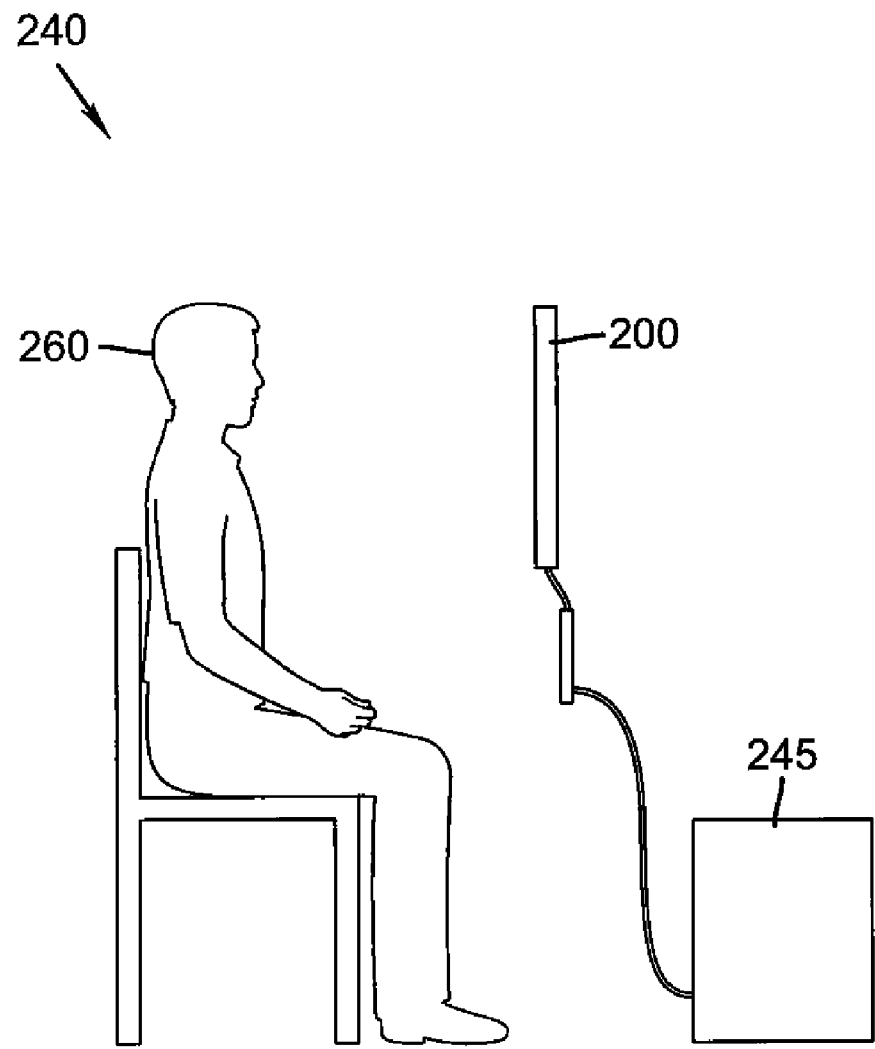
FIG. 6 is an illustration of a system for grading an OLED device.
Figure 7:
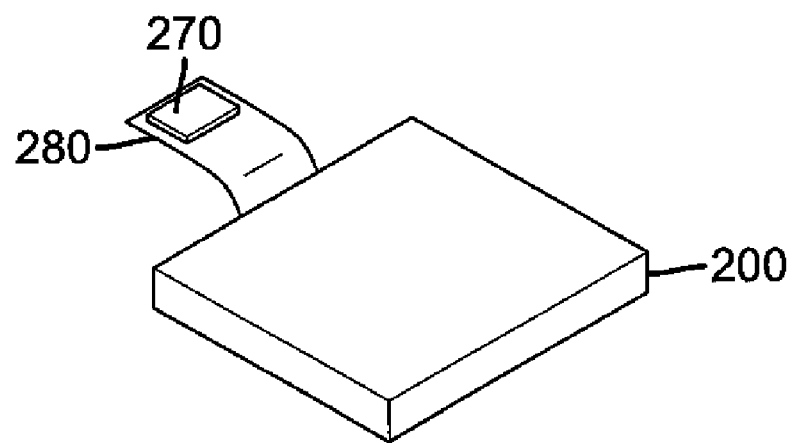
FIG. 7 is an illustration of a display with associated memory.

Referring to FIG. 6, means 240 for grading an OLED device 200 may include an operator 260 manually reviewing an OLED display connected to a computer 245. As used here, grading refers to reviewing the performance of an OLED device and selecting or rejecting the OLED device on the basis of whether the performance of the OLED device meets one or more required specifications, for example salable, repairable, or correctable. The performance of the OLED device can be compared to a variety of specifications associated with a variety of applications for which different performance levels are specified and, as part of the grading process, the OLED device may be assigned to an application whose specifications are met by the OLED device. The grading means may alternatively be automated and include a digital image acquisition system (e.g., such as that shown in FIG. 4) with software for numerically calculating the OLED device performance and comparing the performance with required specifications. Such image and signal processing techniques are known in the art and include, for example, morphological processing, histogram techniques, thresholding, and filtering. FIG. 7 illustrates an OLED device with an associated memory for storing correction parameters. The associated memory 270 may be affixed to the OLED device (as in FIG. 5) or to a connector 280 affixed to the OLED device (as in FIG. 7).

Figure 8:
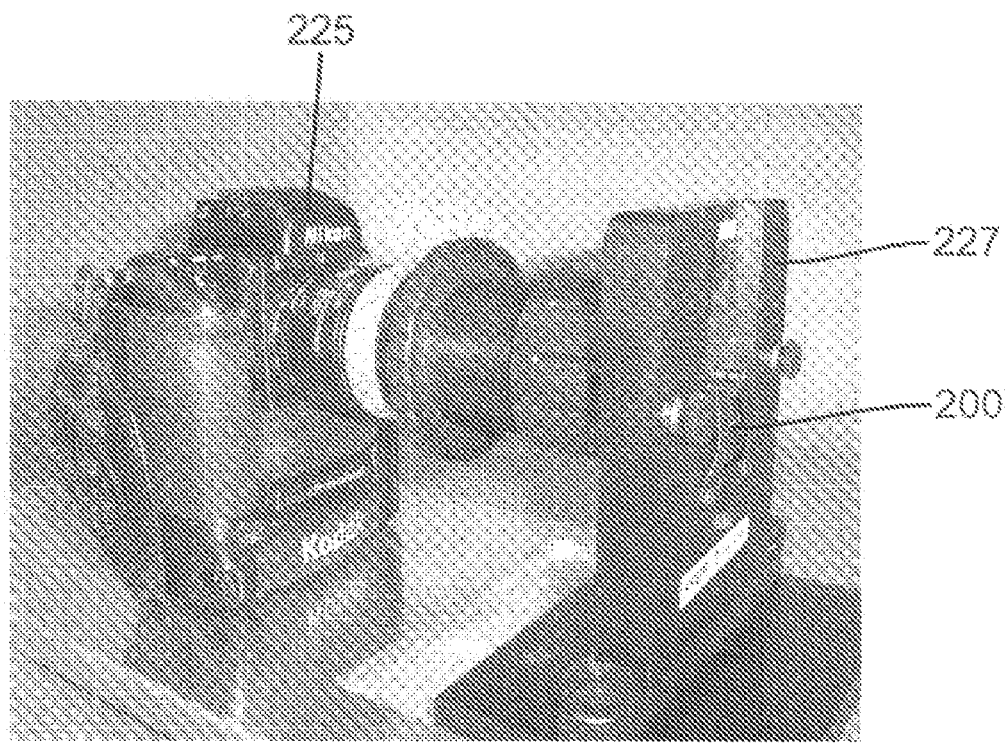
FIG. 8 is a photograph of a measurement and calibration system.

FIG. 8 is a photograph of a measurement and calibration system including a digital camera 225 and a fixture 227 for holding an OLED device 200.

Specific means for measuring the performance characteristics of an OLED device which may be employed in the present invention are known in the art (e.g., U.S. Pat. No. 6,414,661 B1 and U.S. Pat. No. 6,473,065 B1 referenced above), and also include those described, for example, in copending U.S. Ser. No. 10/858,260 referenced above. Means for correcting the uniformity of an OLED device which may be employed in the present invention are also known in the art (e.g., U.S. Pat. No. 6,414,661 B1 and U.S. Pat. No. 6,473,065 B1 referenced above), and also include those described, for example, in copending U.S. Ser. Nos. 10/869,009 and 10/894,729 referenced above. The disclosures of each of such patents and copending applications referenced in this paragraph are hereby incorporated by reference.

The invention has been described in detail with particular reference to certain preferred embodiments thereof, but it will be understood that variations and modifications can be effected within the spirit and scope of the invention.

PARTS LIST 100 manufacture step
110 measure step
120 grading step
130 repair step
140 sell step
150 grading step
160 grading step
180 discard step
190 correct step
199 sell step
200 OLED device
210 manufacturing equipment
215 printed circuit board
220 measurement tool
225 digital camera
227 fixture
230 circuit
240 grading means
245 computer
250 controller
255 integrated circuits
260 operator
270 memory
280 connector

The invention claimed is:

1. A method for manufacturing and correcting OLED devices, comprising the steps of:
   a) manufacturing OLED devices having a plurality of pixels with inherent pixel brightnesses and uniformity variation;
   b) measuring inherent pixel brightnesses and uniformity variation performance for each of the OLED devices;
   c) grading each of the OLED devices based on their inherent performance;
   d) selling OLED devices graded as acceptable without correction of inherent performance;
   e) correcting pixel brightness and uniformity variation performance for at least some of the OLED devices graded as not acceptable to render them acceptable; and
   f) selling OLED devices having pixel brightness and uniformity performance correction.

2. The method of claim 1 further comprising grading the OLED devices which are graded as not acceptable based on inherent performance as correctable or not correctable and providing uniformity correction capability for only the OLED devices graded as correctable.

3. The method of claim 2 further comprising repairing an OLED device graded as not correctable to modify the inherent performance and to obtain a correctable OLED device.

4. The method of claim 1 further comprising repairing an OLED device initially graded as not acceptable based on inherent performance to obtain an OLED device with modified inherent performance graded as acceptable prior to selling.

5. The method of claim 1 further comprising the step of storing the inherent pixel brightness and uniformity variation information measured in step b) in a memory and associating the memory with the OLED device.

6. The method of claim 5 wherein the memory is associated with the OLED device by affixing the memory to the OLED device or to a connector affixed to the OLED device.

7. The method of claim 1 wherein the OLED devices are sold at a first price in step (d) and at a second price in step (f).

8. The method of claim 7 wherein the first price and the second price are different.

9. The method of claim 1 wherein the OLED devices are color devices comprising differently colored pixels and the pixel brightness and uniformity variation information is measured separately for each different color.

10. The method of claim 1 wherein the pixel brightness and uniformity variation performance correction of the OLED devices in step (e) improves manufacturing yield of OLED devices.

11. The method of claim 1 wherein step (a) includes the steps of providing a substrate; forming electronic circuitry including signal and power connections on the substrate; forming an electrode on the substrate; depositing layers of organic materials, including at least one light-emitting layer, over the first electrode; forming a second electrode over the layers of organic materials; encapsulating the OLED device; and attaching electrical connections to the signal and power connections of the OLED device.

12. The method of claim 1 wherein the step of measuring pixel brightness and uniformity variation includes a step of uniformly illuminating every pixel of an OLED device.

* * * * *